United States Patent
Gardner et al.

(10) Patent No.: US 6,225,151 B1
(45) Date of Patent: *May 1, 2001

(54) NITROGEN LINER BENEATH TRANSISTOR SOURCE/DRAIN REGIONS TO RETARD DOPANT DIFFUSION

(75) Inventors: Mark I. Gardner, Cedar Creek; Robert Dawson, Austin; H. Jim Fulford, Jr., Austin; Frederick N. Hause, Austin; Daniel Kadosh, Austin; Mark W. Michael, Cedar Park; Bradley T. Moore; Derick J. Wristers, both of Austin, all of TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/871,469

(22) Filed: Jun. 9, 1997

(51) Int. Cl.[7] .............................. H01L 21/22; H01L 21/38

(52) U.S. Cl. .......................... 438/162; 438/407; 257/548; 257/596

(58) Field of Search .............................. 257/607; 438/305, 438/407

(56) References Cited

U.S. PATENT DOCUMENTS

| | | | |
|---|---|---|---|
| 3,976,511 | * 8/1976 | Johnson | 438/407 |
| 5,223,445 | 6/1993 | Fuse | 437/24 |
| 5,496,751 | * 3/1996 | Wei et al. | 438/305 |
| 5,514,902 | * 5/1996 | Kawasaki et al. | 257/607 |
| 5,516,707 | 5/1996 | Loh et al. | 437/24 |

FOREIGN PATENT DOCUMENTS

| | | |
|---|---|---|
| 0 419 128 A1 | 3/1991 | (EP). |
| 61-263274 | 11/1986 | (JP). |
| 03-011731 | 1/1991 | (JP). |
| 03-038839 | 2/1991 | (JP). |

OTHER PUBLICATIONS

Suppression of Oxidation Enhanced Boron Diffusion in Silicon by Carbon Implantation and Characterization of MOSFETs with Carbon Implanted Channels, Ibrahim Band, Mehmet C. Ozturk, IEEE, Transactions on Electron Devices, pp. 740–744, Proceedings of 11th Inte, Jun. 1997.*

(List continued on next page.)

Primary Examiner—Olik Chaudhuri
Assistant Examiner—William David Coleman
(74) Attorney, Agent, or Firm—Skjerven, Morrill, MacPherson, L.L.P.

(57) ABSTRACT

A nitrogen implanted region formed substantially below and substantially adjacent to a source/drain region of an IGFET forms a liner to retard the diffusion of the source/drain dopant atoms during a subsequent heat treatment operation such as an annealing step. The nitrogen liner may be formed by implantation of nitrogen to a given depth before the implantation of source/drain dopant to a lesser depth. Nitrogen may also be introduced into regions of the IGFET channel region beneath the gate electrode for retarding subsequent lateral diffusion of the source/drain dopant. Such nitrogen introduction may be accomplished using one or more angled implantation steps, or may be accomplished by annealing an implanted nitrogen layer formed using a perpendicular implant aligned to the gate electrode. The liner may be formed on the drain side of the IGFET or on both source and drain side, and may be formed under a lightly-doped region or under a heavily-doped region of the drain and/or source. Such a liner is particularly advantageous for boron-doped source/drain regions, and may be combined with N-channel IGFETs formed without such liners.

37 Claims, 8 Drawing Sheets

OTHER PUBLICATIONS

Suppression of Oxidation Enhanced Boron Diffusion in Silicon by Carbon Implantation and Characterization of MOSFETs with Carbon Implanted Channels, IEEE Transactions on Electron Devices, pp. 740–744, Jan. 1997.*

Nove NICE(Nitrogen Implantation into CMOS Gate Electrode and Source–Drain) Structure for High Reliability and High Performance 0.25µ Dual Gate CMOS, Kuroi et al. IEEE Transaction on lectron Devices, pp. 325–328, Dec. 1993.*

Silicon Processing for the VLSI Era, vol. 1:Process Technology by Stanley Wolf, Published by Lattice Press, Sunset Beach California, 1986, pp. 182–195, 209–211, 280–283, 294, 308, 321–327.

Silicon Processing for the VLSI Era, vol. 2:Process Integration by Stanley Wolf, Published by Lattice Press, Sunset Beach, california, 1990, p. 73.

Silicon Processing for the VLSI Era, vol. 3:The Submicron MOSFET by Stanley Wolf, Published by Lattice Press, Sunset Beach, California, 1995, pp. 305–313.

C.T. Liu et al, 1996 Symposium on VLSI Technology Digest of Technical Papers, 25Å Gate Oxide without Boron Penetration for .025 and 0.3–µm PMOSFETs, 1996, pp. 18–19.

T. Kuroi et al., IEDM 93–325, "Novel NICE (Nitrogen Implantation into CMOS Gate Electrode and Source–Drain) Structure for High Reliability and High Performance 0.25 µm Dual Gate CMSO", 1993, pp. 13.2.1–13.2.4.

Mizuki Segawa et al., IEDM 96–443, "A 0.18µm Ti–Salicided p–MOSFET with Shallow Junctions Fabricated by Rapid Thermal Processing in an $NH_3$ Ambient", 1996, pp. 17.3.1–17.3.4.

C.T. Liu et al., IEDM 96–499, "High Performance 0.2µm CMOS with 25 Å Gate Oxide Grown on Nitrogen Implanted Si Substrates", 1996, pp. 19.2.1–19.2.4.

S. Shimizu et al., IEDM 95–859, "Impact of Surface Proximity Gettering and Nitrided Oxide Side–Wall Spacer by Nitrogen Implantation on Sub–Quarter Micron CMOS LDD FETs", 1995, pp. 34.4.1–34.4.4.

Murakami, Takashi et al., "Application of Nitrogen Implantation to ULSI," Nuclear Instruments and Methods in Physics Research, Section B: Beam Interactions With Materials & Atoms, vol. 121, No. 1, Jan. 1997, pp. 257–261, XP004057918.

S. Shimizu et al., "Impact of Surface Proximity Gettering and Nitrided Oxide Side–Wall Spacer by Nitrogen Implantation on Sub–Quarter Micron CMOS LDD Fets,"Technical Digest of the International Electron Devices Meeting (IEDM) Washington, IEEE, Dec. 10–13, 1995, pp. 859–862, XP000624809.

A. Furukawa et al., "Channel Engineering in Sub–quarter-–micron MOSFETs Using Nitrogen Implantation for Low Voltage Operation," 1996 Symposium on VLSI Technology, Digest of Technical Papers, IEEE, Honolulu, Jun. 11–13, 1996, pp. 62–63, XP000639287.

S. Haddad and M. Liang, "Improvement of Thin–Gate Oxide Integrity Using Through–Silicon–Gate Nitrogen Ion Implantation, " IEEE Electron Device Letters, vol. EDL–8, No. 1, Feb.1987, pp. 58–60, XP000673836.

* cited by examiner

NITROGEN LINER BENEATH TRANSISTOR SOURCE/DRAIN REGIONS TO RETARD DOPANT DIFFUSION

BACKGROUND OF THE INVENTION

1. Field of the Invention

The present invention relates to the manufacture of semiconductor structures, and more particularly to the formation of semiconductor regions within a transistor.

2. Description of the Related Art

The formation of high performance transistor structures requires the accurate placement of carefully controlled numbers of dopant atoms in and around the source and drain regions of the transistor. Ion implantation has increasingly replaced gaseous a diffusion methods of doping for a number of reasons, including the ability to implant a carefully controlled amount of dopant into an underlying material to a controlled depth within the underlying material.

In most manufacturing flows, however, subsequent heat treatment steps result in sometimes large amounts of dopant diffusion which alters the location of previously-implanted dopant atoms. Such unwanted diffusion, for example, makes the formation of shallow junction regions in the transistor source and drain regions increasingly difficult.

Arsenic has virtually replaced phosphorus as the n-type dopant of choice for implantation of heavily-doped regions, such as source/drain regions, largely because the heavier arsenic atom diffuses less (for a given heat treatment operation) than the lighter phosphorus atom, and consequently implanted profiles are easier to maintain through subsequent heat treatment operations. For p-type regions, boron is frequently used (for silicon semiconductor devices). The boron atom diffuses more readily than arsenic, and consequently p-type implant profiles are typically more difficult to control. This makes the fabrication of high performance CMOS devices increasingly difficult because the shallow junctions needed for source and drain regions are difficult to maintain through subsequent heat treatment operations.

Moreover, lateral diffusion of dopants from the source/drain regions toward the transistor channel region underlying the gate electrode is also of great concern. As complex doping profiles (such as lightly doped drain (LDD) structures) have become commonplace in high performance semiconductor fabrication, maintaining the spacing between heavily doped source/drain regions and the channel region is increasingly important.

SUMMARY OF THE INVENTION

A method of forming an insulated-gate field effect transistor (IGFET) includes introducing a dopant into the semiconductor body to form a first region of a first source/drain for the IGFET, and forming a liner substantially beneath the first region of the first source/drain, to retard subsequent diffusion of dopant comprising the first region of the first source/drain. The first region may include a lightly-doped region and may as well include a heavily-doped region. Moreover, the introducing step may be performed before or after the forming step. The liner may be formed to include, for example, nitrogen or carbon, and may be advantageously formed by ion implantation of a suitable material containing such an element. The liner may be formed on one side (e.g., a drain side) of an IGFET or on both source and drain sides.

The liner may be formed as part of IGFETs of one conductivity type without so forming as part of other IGFETs of opposite conductivity type. For example, a P-channel IGFET which includes a liner may be advantageously combined with an N-channel IGFET without such a liner, to afford more similar behavior of dopant diffusion between the N- and P-channel IGFETs. Alternatively, a P-channel IGFET which includes a liner may also be advantageously combined with an N-channel IGFET having such a liner.

In another embodiment of the present invention, a method of forming an insulated-gate field effect transistor (IGFET) includes introducing a dopant into a semiconductor body to form a source/drain region for the IGFET, and forming a nitrogen liner beneath the source/drain region. The dopant may be introduced either before or after the nitrogen liner is formed, and the nitrogen liner may be formed adjacent to or separated from the source/drain region. The nitrogen liner may be formed to retard vertical diffusion of the dopant and also to retard lateral diffusion as well.

The nitrogen liner may be formed beneath the source drain regions (which may be formed by an implant normal to the top surface of the semiconductor body), and may be formed to laterally extend beneath a gate electrode of the IGFET. Such a lateral extension beneath the gate electrode may be formed by one or more angled nitrogen implants, or by annealing and consequently laterally-diffusing a previously-implanted nitrogen region. The lateral extension of the nitrogen liner, which may extend up to the top surface of the semiconductor body, retards the lateral diffusion of the dopant in a direction parallel to the top surface. Moreover, the nitrogen liner may be formed either before or after the gate electrode is formed.

In one embodiment of the invention suitable for a semiconductor process, a method of forming an insulated-gate field effect transistor (IGFET) includes providing a semiconductor body having a top surface, introducing a dopant into the semiconductor body to form source/drain regions for the IGFET, and forming a nitrogen liner beneath the source/drain regions to retard diffusion of the dopant during a subsequent high temperature step. The dopant may either be introduced before or after the nitrogen liner is formed. The nitrogen liner may include a first segment formed below the source region of the IGFET and spaced apart from a second segment formed below the drain region of the IGFET. Either or both the first and second segments may be aligned to or may partially extend beneath the gate electrode. Alternatively, the nitrogen liner may be formed as a continuous layer beneath the source region, the gate electrode, and the drain region. The portion of the continuous layer beneath the gate electrode may be closer to the top surface than are remaining portions.

In an additional embodiment of the invention, a method of forming a nitrogen liner for an insulated-gate field effect transistor (IGFET) includes providing a semiconductor body having a top surface, implanting nitrogen into the semiconductor body beneath source/drain regions of the IGFET to a first depth below the top surface of the semiconductor body, and introducing a dopant within the source/drain regions of the IGFET at a depth less than the first depth.

In yet an additional embodiment of the invention, a semiconductor IGFET structure includes a semiconductor body having a top surface, source/drain regions including a dopant, and a nitrogen liner disposed below the source/drain regions for retarding diffusion of the dopant during a subsequent heat treatment step. The nitrogen liner may extend beneath the gate electrode, or may be aligned to the gate electrode, on either the source or drain side of the gate electrode.

The nitrogen liner advantageously retards the diffusion of dopants of either conductivity type (either n-type or p-type). The dopant may be chosen from arsenic, phosphorus, boron, BF, or $BF_2$. The nitrogen liner may be formed using either a molecular ($N_2$) or atomic (N) nitrogen implant. Moreover, such a nitrogen implant may be performed using a single implant, or using two different implants having different energies to widen the nitrogen liner. A widened nitrogen liner may also be formed by using two different implants having similar or identical energies, one being $N_2$ and the other N.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE PREFERRED EMBODIMENTS

Figure 1A:
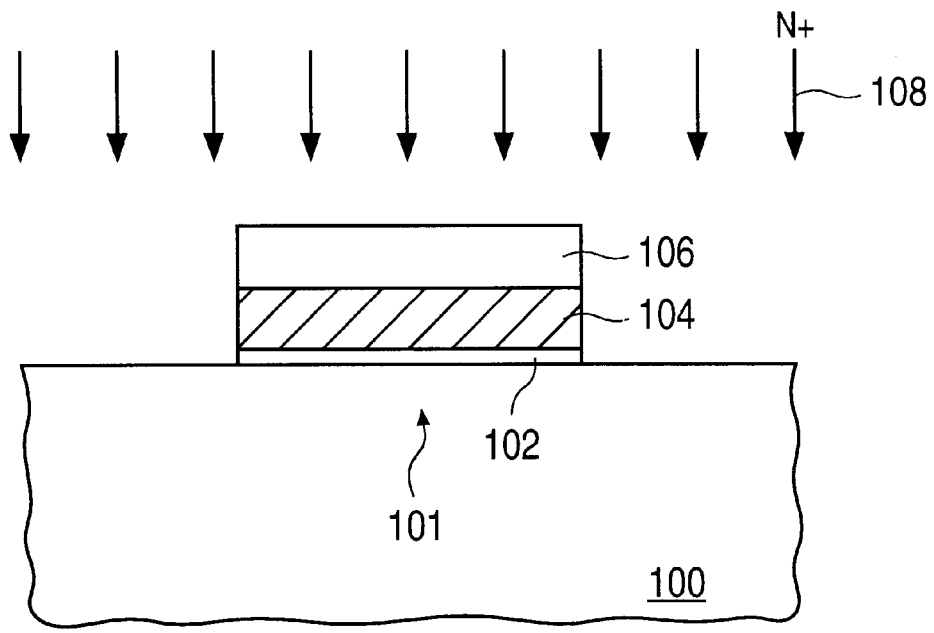
FIGS. 1A–1E are cross-sectional views of a semiconductor process flow in accordance an embodiment of the current invention.

One embodiment of the present invention is illustrated in FIGS. 1A–1E in which an implanted nitrogen-rich region is formed beneath the source/drain regions of a P-channel IGFET to retard the downward diffusion of implanted boron forming the source/drain regions. Referring to FIG. 1A, a semiconductor body 100 is shown upon which an IGFET is to be formed. Such a semiconductor body 100 may be an n-type wafer, a p-type wafer, an epitaxially grown layer of either conductivity type, or an N-well or P-well formed upon any such structures. For illustrative purposes here, semiconductor body 100 is an N-well formed within a P– (i.e., lightly-doped) epitaxial layer which is disposed upon a P+ (i.e., heavily-doped) wafer.

A gate dielectric 102 is shown formed upon the semiconductor body 100. Such a gate dielectric 102 may be formed to a thickness in the range of 25–200 Å, and may be formed of a silicon oxide, a silicon oxynitride, a silicon nitride, or any other suitable insulating material which may be formed of an appropriate thickness. A polysilicon gate 104 is shown formed atop the gate dielectric 102 having a thickness, for example, in the range of 500–3000 Å. The polysilicon gate 104 is defined by a patterned photoresist layer 106 disposed above the polysilicon gate 104 and used as an etch mask, as is well known in the art. Such a patterned photoresist layer 106 is, for example, approximately 1.0 microns thick.

Figure 1B:
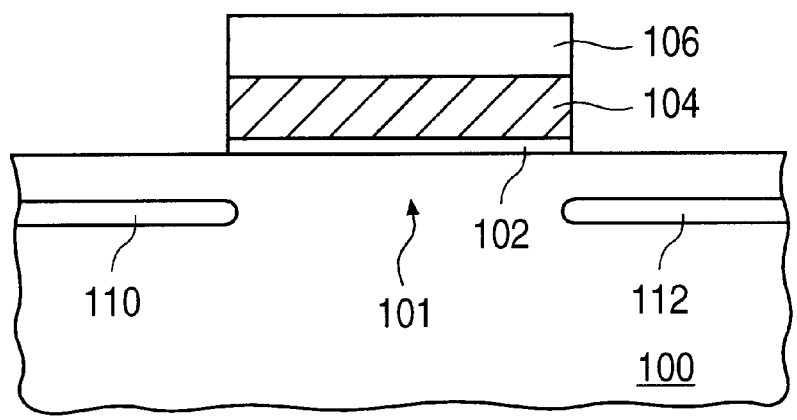

Continuing with the process sequence, a nitrogen implant 108 is next performed at an angle of 0 degrees (i.e., normal to the semiconductor body 100 surface) as shown in FIG. 1A using the patterned photoresist layer 106 as a mask to protect the channel region 101 beneath the gate dielectric 102. The resulting structure is shown in FIG. 1B, and includes nitrogen-rich regions 110 and 112 which are self-aligned to the edges of the polysilicon gate 104. The nitrogen implant 108 may be performed at an energy in the range of 5–50 keV at a dose in the range of $1\times10^{14}$–$4\times10^{16}$ atoms/cm$^2$, to achieve the placement of nitrogen-rich regions 110 and 112 at a depth in the range of 0.1–0.5 microns. Because of the masking effect of the patterned photoresist layer 106, no nitrogen reaches (for this embodiment) either the polysilicon gate 104, the gate dielectric 102, or the channel region 101.

Figure 1C:
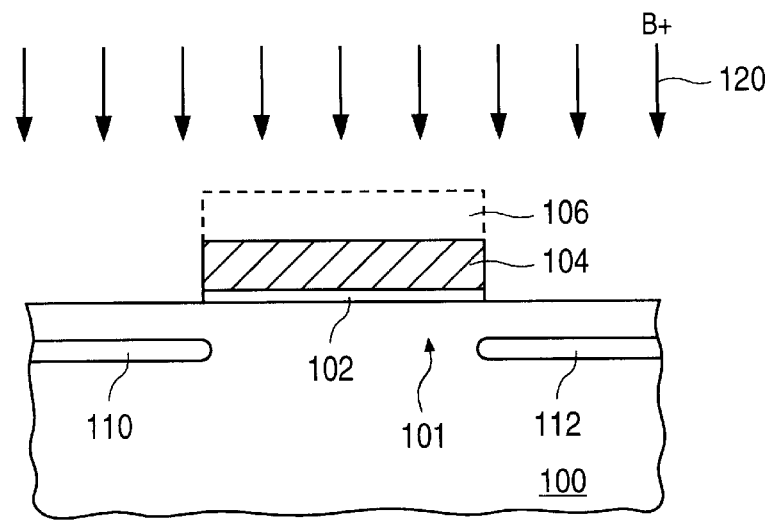
Figure 1D:
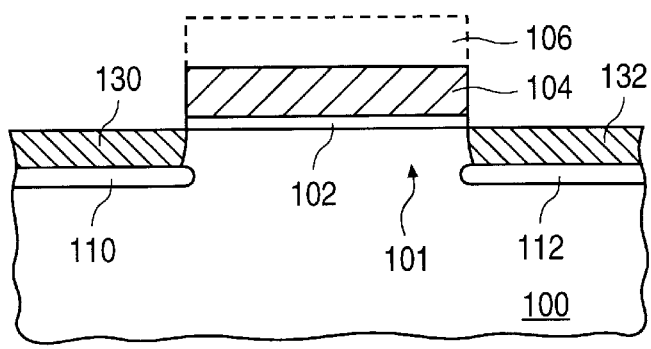

Continuing with the process sequence, the patterned photoresist layer 106 is preferably removed and a boron implant 120 is next performed normal to the semiconductor body 100 surface as shown in FIG. 1C using the polysilicon gate 104 as a mask to protect the gate dielectric 102 and the channel region 101 beneath the gate dielectric 102. Alternatively, the boron implant 120 may be performed using the patterned photoresist layer 106 and the polysilicon gate 104 as a combined mask. The boron implant 120 may be performed using any suitable implant material containing atomic boron, including boron, BF, and $BF_2$. Moreover, the boron implant 120 may be performed using a thin implant oxide covering the surface of the semiconductor body over the source/drain regions (not shown). The resulting structure is shown in FIG. 1D, and includes implanted source region 130 and implanted drain region 132 which are self-aligned to the edges of the polysilicon gate 104. The boron implant 120 may be performed at an energy in the range of 5–80 keV at a dose in the range of $1\times10^{15}$–$5\times10^{15}$ atoms/cm$^2$, to achieve the placement of the implanted source region 130 and implanted drain region 132 at a depth in the range of 0.05–0.3 microns. The boron implant 120 is preferably implanted into the polysilicon gate 104 at the same time as when forming the implanted source region 130 and implanted drain region 132, but may also be prevented from reaching the polysilicon gate 104 if an appropriate thickness of patterned photoresist layer 106 remains in place. Additional techniques for implantation into polysilicon gate electrodes are disclosed in copending commonly-assigned application entitled "Ion Implantation into a Gate Electrode Layer Using an Implant Profile Displacement Layer", naming inventors Mark I. Gardner, Robert Dawson, H. Jim Fulford, Jr., Frederick N. Hause, Mark W. Michael, Bradley T. Moore, and Derick J. Wristers, filed on Apr. 21, 1997, and having serial number (Unassigned, Attorney Docket No. M-4000 US), which application is incorporated by reference herein in its entirety.

In a typical embodiment for a CMOS process the N-channel transistors are processed in like manner as the P-channel transistor discussed above, except that an n-type dopant atom (e.g., arsenic) is implanted to form the N-channel source/drain regions. As is well known in the art, the P-channel transistors may be masked with photoresist during the n-type source/drain implant step, which photoresist serves to prevent the n-type dopant from reaching the P-channel gate, channel, and source/drain regions.

Figure 1E:
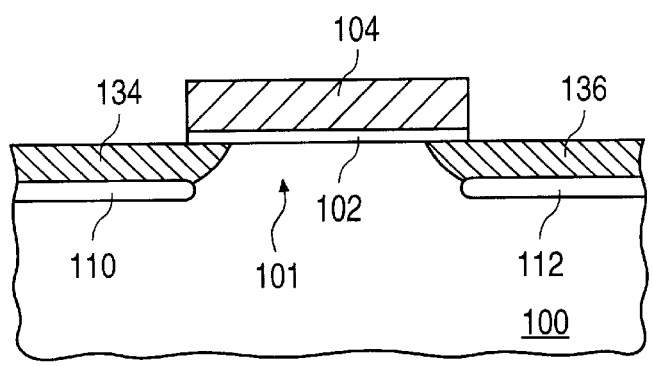

Continuing with the process sequence, the patterned photoresist layer 106 (if still present) is removed and the previous boron implant 120 is annealed. The resulting structure is shown in FIG. 1E which shows annealed source region 134 and annealed drain region 136. The annealing of the implanted boron atoms also causes the lateral diffusion of the boron dopant atoms in the direction toward the channel region 101, and results in a greater overlap between the polysilicon gate 104 and the annealed source region 134 and annealed drain region 136 than was earlier present between the polysilicon gate 104 and the implanted source region 130 and implanted drain region 132. In contrast, however, the presence of the nitrogen-rich regions 110 and 112 retards the downward diffusion of the implanted boron dopant atoms within the implanted source region 130 and implanted drain region 132. Consequently, while the lateral diffusion of the boron dopant atoms may be noteworthy, the vertical diffusion is greatly diminished and thus affords the formation of a shallow source/drain region. Moreover, the lessened vertical diffusion prevents the implanted boron from reaching underlying structures, such as an underlying P+ region (not shown).

It should be noted that in the above-described sequence, the nitrogen implant 108 does not reach the polysilicon gate 104 because of the masking effect of the patterned photoresist layer 106. As an alternative embodiment, the nitrogen implant 108 may be performed without any masking photoresist layer, in which case the nitrogen would be implanted into the polysilicon gate 104 as well. Similar techniques are described more fully in copending commonly-assigned application entitled "Composite Gate Electrode Incorporating Dopant Diffusion-Retarding Barrier Layer Adjacent to Underlying Gate Dielectric", naming inventors Mark I. Gardner, Robert Dawson, H. Jim Fulford, Jr., Frederick N. Hause, Daniel Kadosh, Mark W. Michael, Bradley T. Moore, and Derick J. Wristers, filed on Apr. 21, 1997, and having serial number (Unassigned, Attorney Docket No. M-3983 US), which application is incorporated by reference herein in its entirety.

Figure 2A:
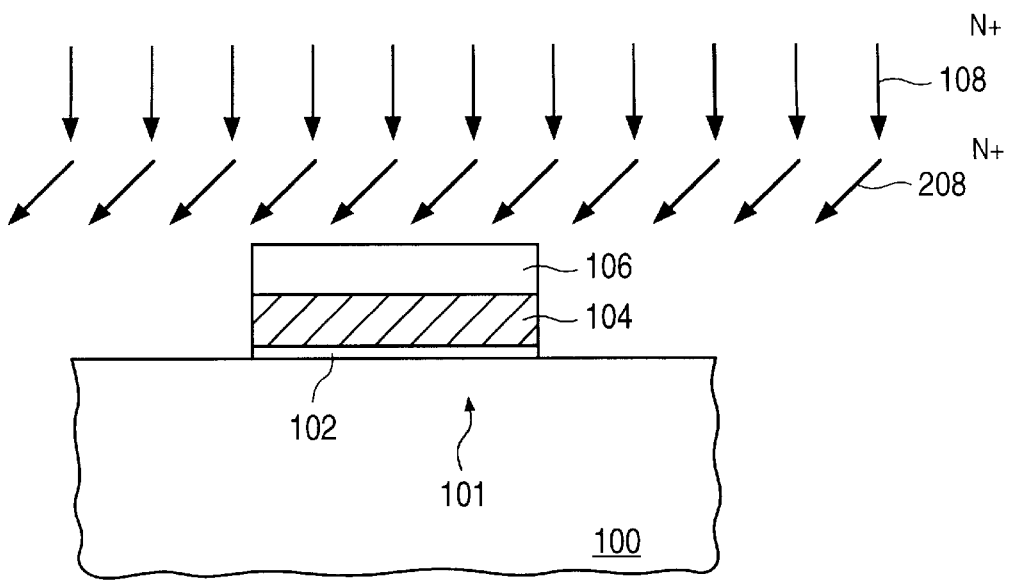
FIGS. 2A–2C are cross-sectional views of a semiconductor process flow in accordance with another embodiment of the current invention.
Figure 2B:
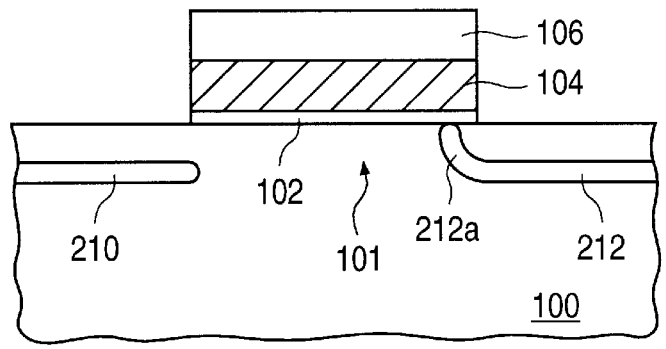
Figure 2C:
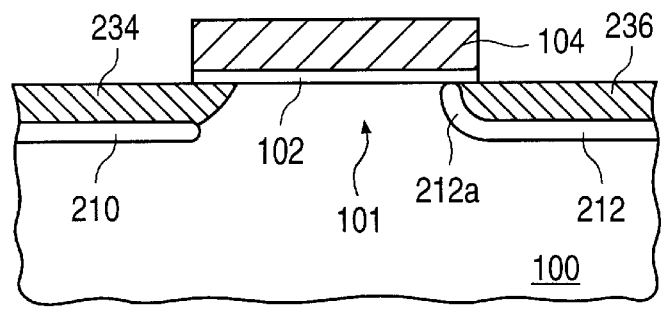

An additional embodiment of the present invention is illustrated in FIGS. 2A–2C in which an implanted nitrogen-rich region is formed beneath the source/drain regions of a P-channel IGFET to retard the downward diffusion of implanted boron forming the source/drain regions (as in the FIG. 1A–1E sequence), but also is formed beneath the gate on the drain side of the transistor. Referring to FIG. 2A, a semiconductor body 100 is shown upon which an IGFET is to be formed. Such a semiconductor body 100 is, for illustrative purposes here, an N-well formed within a P– epitaxial layer which is disposed upon a P+ wafer. A gate dielectric 102, a polysilicon gate 104, and a patterned photoresist layer 106 are shown formed upon the semiconductor body 100, as before.

Continuing with the process sequence, a nitrogen implant 108 is next performed at an angle of 0 degrees (i.e., normal to the semiconductor body 100 surface) as shown in FIG. 2A using the patterned photoresist layer 106 as a mask to protect the channel region 101 beneath the gate dielectric 102. Moreover, a second nitrogen implant 208 is next performed at a substantial angle (e.g., 45 degrees) to the semiconductor body 100 surface as shown in FIG. 2A still using the patterned photoresist layer 106 as a mask to protect the channel region 101 beneath the gate dielectric 102. However, due to the angle of the nitrogen implant 208, some of the implanted nitrogen is implanted into a portion of the channel region 101 just underlying the right side (i.e., the drain side) of the polysilicon gate 104. The resulting structure is shown in FIG. 2B, and includes nitrogen-rich regions 210 and 212 which are self-aligned to the edges of the polysilicon gate 104. Both nitrogen implant 108 and nitrogen implant 208 may be performed at an energy in the range of 5–50 keV at a dose in the range of $1\times10^{14}$–$4\times10^{16}$ atoms/$cm^2$, to achieve the placement of nitrogen-rich regions 210 and 212 at a depth in the range of 0.1–0.5 microns. Because the masking effect of patterned photoresist layer 106, no nitrogen reaches (for this embodiment) the greatest portions of either the polysilicon gate 104, the gate dielectric 102, or the channel region 101. But a small portion of the channel region 101 disposed closest to the drain (the right-most portion) receives implanted nitrogen due to the implant angle of nitrogen implant 208, and extends the nitrogen-rich region 212, being portion 212a, beneath the polysilicon gate 104 and up to the top surface of the semiconductor body 100. The right-most portion of the gate dielectric 102 and the right-most portion of the polysilicon gate 104 also receive implanted nitrogen from the nitrogen implant 208.

Continuing with the process sequence, a boron implant (not shown) is next performed normal to the semiconductor body 100 surface as described previously (with regard to FIG. 1C) using the polysilicon gate 104 (and possibly the patterned photoresist layer 106, as well) as a mask to protect the gate dielectric 102 and the channel region 101 beneath the gate dielectric 102. The patterned photoresist layer 106 (if still present) is removed and the boron implant is then annealed, as previously described. The resulting structure is shown in FIG. 2C which shows annealed source region 234 and annealed drain region 236. The annealing of the implanted boron atoms also causes the lateral diffusion of the boron dopant atoms in the direction toward the channel region 101, and results in a greater overlap between the polysilicon gate 104 and the annealed source region 234 than was earlier present before the annealing operation. As before, the presence of the nitrogen-rich regions 210 and 212 retards the downward diffusion of the implanted boron dopant atoms within the annealed source region 234 and the annealed drain region 236. However, the presence of portion 212a within nitrogen-rich region 212 greatly reduces the lateral diffusion of boron dopant atoms in the direction of the channel region 101. Consequently, while the lateral diffusion of the boron dopant atoms may be noteworthy in the region between the polysilicon gate 104 and the annealed source region 234, the lateral diffusion in the region between the polysilicon gate 104 and the annealed drain region 236 is greatly reduced, As before, however, the vertical diffusion of implanted boron dopant atoms is greatly reduced and are thus prevented from reaching underlying structures, such as an underlying P+ region (not shown). It should be noted that in the above-described sequence, the nitrogen implants 108 and 208 may be performed with or without a masking photoresist layer.

The presence of nitrogen in the gate dielectric 102 near the drain improves oxide quality where the electric-field in both the gate dielectric 102 and the transistor channel region is highest (namely near the edge of the drain region). It should be noted, however, that a nitrogen dose above $4\times10^{16}$ atoms/$cm^2$ within the corner of the gate dielectric 102 nearest the drain may actually degrade the transistor.

While the above sequence is shown utilizing a single angled implant to achieve an asymmetrical transistor structure, a second angled implant at an angle of, for example, 45 degrees from the opposite direction along the top surface of the semiconductor body 100 may also be performed to achieve the same reduction of dopant lateral diffusion on the source side of the transistor as well as the drain side shown in FIG. 2C. Moreover, if four such angled implants are performed, each from a different direction into the semiconductor body 100, such as respective directions of north, east, south, and west, then both east/west oriented transistors and north/south oriented transistors may be fabricated with symmetrical source/drain regions.

Figure 3A:
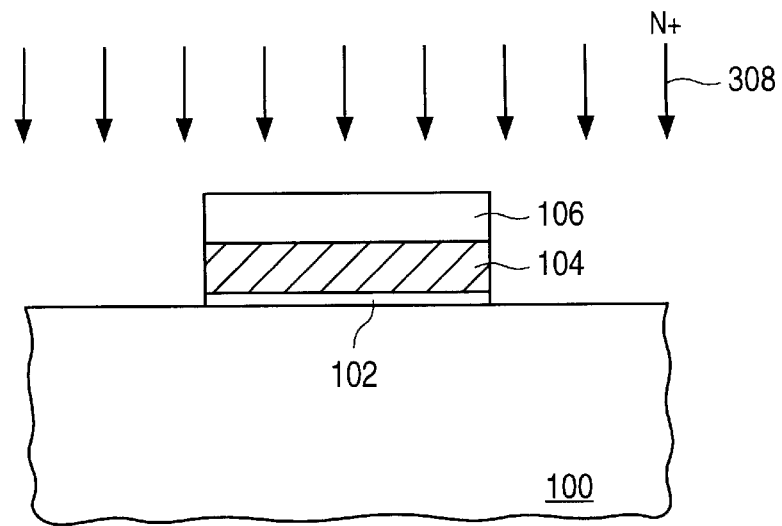
FIGS. 3A–3D are cross-sectional views of a semiconductor process flow in accordance with another embodiment of the current invention.

Another embodiment of the present invention is illustrated in FIGS. 3A–3D in which implanted nitrogen-rich regions are formed beneath each of the source/drain regions of a P-channel IGFET and also are introduced underlying the gate on both the source and drain side of the transistor by annealing the previously implanted nitrogen beneath the source/drain regions, rather than using four different angled implantation steps. Referring to FIG. 3A, a semiconductor body 100 is shown upon which an IGFET is to be formed. Such a semiconductor body 100 is, for illustrative purposes here, an N-well formed within a P− epitaxial layer which is disposed upon a P+ wafer. A gate dielectric 102, a polysilicon gate 104, and a patterned photoresist layer 106 are shown formed upon the semiconductor body 100, as before.

Figure 3B:
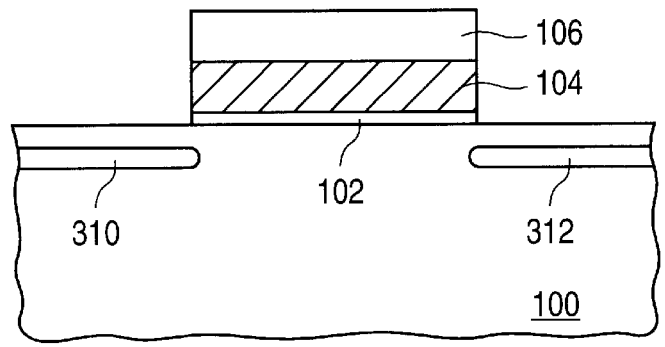

Continuing with the process sequence, a nitrogen implant 308 is next performed at an angle of o degrees (i.e., normal to the semiconductor body 100 surface) as shown in FIG. 3A using the patterned photoresist layer 106 as a mask to protect the channel region 101 beneath the gate dielectric 102. The nitrogen implant 308 may also be performed with a thin implant oxide covering the surface above the source/drain regions (not shown). The resulting structure is shown in FIG. 3B, and includes nitrogen-rich regions 310 and 312 which are self-aligned to the edges of the polysilicon gate 104. Nitrogen implant 308 may be performed at an energy in the range of 5–50 keV at a dose in the range of $1 \times 10^{14}$–$4 \times 10^{16}$ atoms/cm$^2$, to achieve the placement of nitrogen-rich regions 310 and 312 at a depth in the range of 0.1–0.5 microns. Because the masking effect of pattern ed photoresist layer 106, no nitrogen reaches (for this embodiment) either the polysilicon gate 104, the gate dielectric 102, or the channel region 101.

Figure 3C:
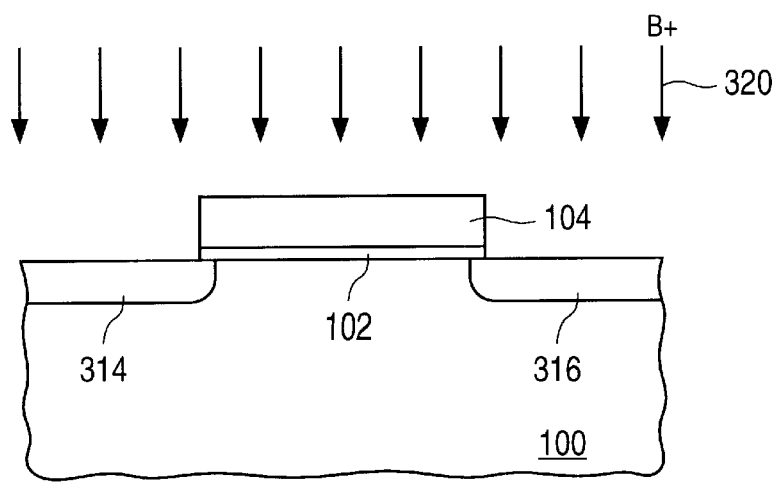

Continuing with the process sequence, the patterned photoresist layer 106 is removed and an anneal operation is performed to afford a repair of the lattice damage arising from the nitrogen implant 308. This anneal operation also causes the nitrogen-rich regions 310 and 312 to diffuse because of the heat encountered during the annealing step. The anneal operation may b e performed using a tube anneal or preferably using an RTA anneal at 950–1100° C. for 10–30 seconds. The resulting structure is shown in FIG. 3C, which shows enlarged nitrogen-rich regions 314 and 316 extending laterally under the edges of the polysilicon gate 104, extending deeper than the pre-anneal implanted nitrogen-rich regions 310 and 312, respectively, and extending to the surface of the semiconductor body 100.

Figure 3D:
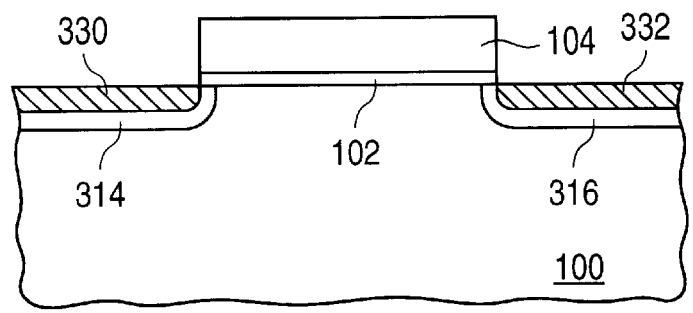

Continuing with the process sequence, a boron implant 320 is next performed normal to the semiconductor body 100 surface as described previously (with regard to FIG. 1C) using the polysilicon gate 104 as a mask to protect the gate dielectric 102 and the channel region 101 beneath the gate dielectric 102. The boron implant 320 may be performed using any suitable implant material containing atomic boron, including boron, BF, and BF$_2$. This boron implant 320 forms the source/drain regions for the P-channel transistor. Moreover, the boron implant 320 may be performed using a thin implant oxide covering the surface of the semiconductor body over the source/drain regions (not shown). The boron implant is then annealed, as previously described. The resulting structure is shown in FIG. 3D which shows annealed source region 330 and annealed drain region 332. The enlarged nitrogen-rich region 314 and enlarged nitrogen-rich region 316 each forms a "liner" or "pocket" to contain the lateral and downward diffusion of the implanted boron dopant atoms which would otherwise occur in the absence of such a "liner." The use of an anneal to form the nitrogen liner laterally adjacent to the source/drain regions may be simpler than four separate implanting steps, but serves to symmetrically contain the boron lateral diffusion in like manner as if placed by four separate implanting steps. It should be noted that in the above-described sequence, the nitrogen implant 308 may be performed with or without a masking photoresist layer.

Figure 4A:
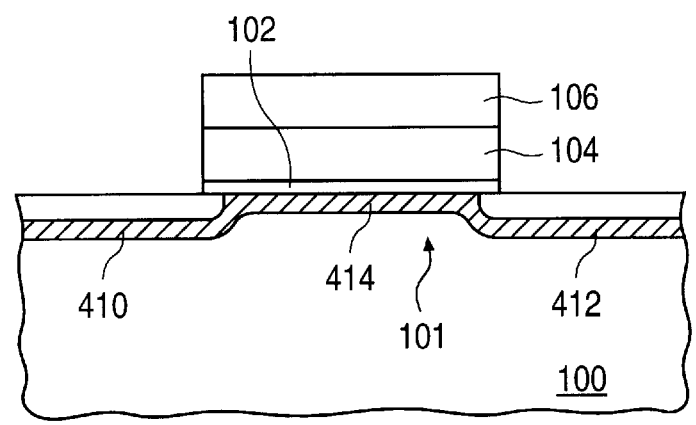
FIGS. 4A–4B are cross-sectional views of a semiconductor process flow in accordance with yet another embodiment of the current invention.
Figure 4B:
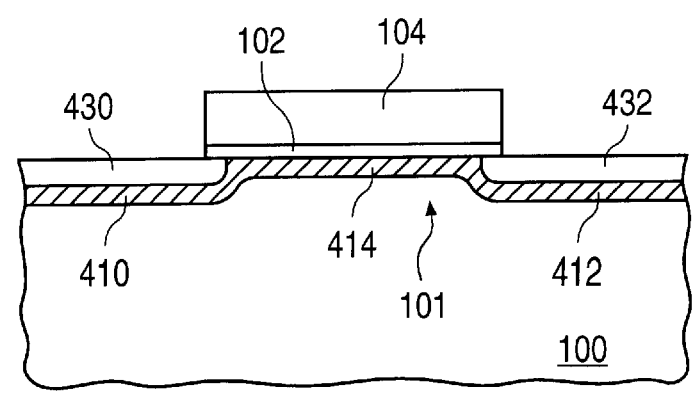

An additional embodiment of the present invention is illustrated in FIGS. 4A–4B, in which an implanted nitrogen-rich region is formed beneath the source/drain regions of a P-channel IGFET as well as below the gate dielectric region within the channel region 101. Referring to FIG. 4, a semiconductor body 100, a gate dielectric 102, and a polysilicon gate 104 are shown, similarly to the above-discussed embodiments. The polysilicon gate 104 is defined by a patterned photoresist layer 106 disposed above the polysilicon gate 104 and used as an etch mask, as is well known in the art.

Continuing with the process sequence, a nitrogen implant (not shown) is performed at an angle of 0 degrees (i.e., normal to the semiconductor body 100 surface). This implant forms nitrogen-rich regions 410 and 412 disposed beneath the source/drain regions of the transistor. However, if the thickness of the polysilicon gate 104 and the patterned photoresist layer 106 are appropriate (or alternatively, if patterned photoresist layer 106 is already removed), the nitrogen implant penetrates the polysilicon gate 104, and the gate dielectric 102, and introduces nitrogen atoms into the channel region 101. The combined thickness of polysilicon gate 104 and patterned photoresist layer 106 (if still present) may be adjusted to achieve a shallower nitrogen implant within the channel region 101 than within the source/drain regions. The resulting structure is shown in FIG. 4A, and includes nitrogen-rich regions 410 and 412 which are self-aligned to the edges of the polysilicon gate 104, and further shows nitrogen-rich region 414 disposed underlying the gate dielectric 102 fully across the channel region 101 of the transistor. The nitrogen implant may be performed at an energy in the range of 5–50 keV at a dose in the range of $1 \times 10^{14}$–$4 \times 10^{16}$ atoms/cm$^2$, to achieve the placement of nitrogen-rich regions 410 and 412 at a depth in the range of 0.01–0.5 microns, and preferably results in the placing of nitrogen-rich region 414 at a depth in the range of 0.02–0.15 microns. Additionally, nitrogen will also be placed within the polysilicon gate 104 by such an implant.

Continuing with the process sequence, the patterned photoresist layer 106 is removed (if still present) and a boron implant (not shown) is next performed normal to the semiconductor body 100 surface (as discussed regarding FIG. 1C) to form the source/drain regions of the P-channel transistor, similarly to that discussed above. The polysilicon gate 104 acts as a mask to protect the gate dielectric 102 and the channel region 101 beneath the gate dielectric 102 from the boron implant. The resulting structure is shown in FIG. 4B, and includes implanted source region 430 and implanted drain region 432 which are self-aligned to the edges of the polysilicon gate 104. The boron implant may be performed at an energy in the range of 5–50 keV at a dose in the range of $1 \times 10^{15}$–$5 \times 10^{15}$ atoms/cm$^2$, to achieve the placement of the implanted source region 430 and implanted drain region 432 at a depth in the range of 0.05–0.3 microns. The boron implant is preferably implanted into the polysilicon gate 104 at the same time as when forming the implanted source regions of the transistor, and is preferably performed without any overlying patterned photoresist layer 106.

The presence of the nitrogen-rich regions 410 and 412 forms a "liner" which retards the diffusion of the implanted boron dopant atoms within the source/drain regions 430, 432, both vertically as well as laterally. The presence of nitrogen-rich region 414 within the channel region 101 contributes to enhanced oxide quality and transistor reliability. The presence of implanted nitrogen within the polysilicon gate 104 is advantageous as it contributes to enhanced oxide quality due to the presence of nitrogen at the polysilicon/oxide interface. Moreover, the presence of implanted nitrogen within the polysilicon gate 104 helps retard boron diffusion through the gate dielectric 102 and into the channel region 101. It should be noted that in the above-described sequence, the nitrogen implant may be performed without any masking photoresist layer.

As an alternative embodiment, a dual nitrogen implant (not shown) may be performed to optimize the depth of implanted nitrogen within the polysilicon and below the source/drain regions. For example, a first nitrogen implant is performed at a first energy, while a second nitrogen implant is performed having a second energy higher than the first energy. Of course, these two implants may be performed in either order, and could be performed at different points in the process flow. For example, one of the implants may be performed using an implant oxide and the other without.

Figure 5A:
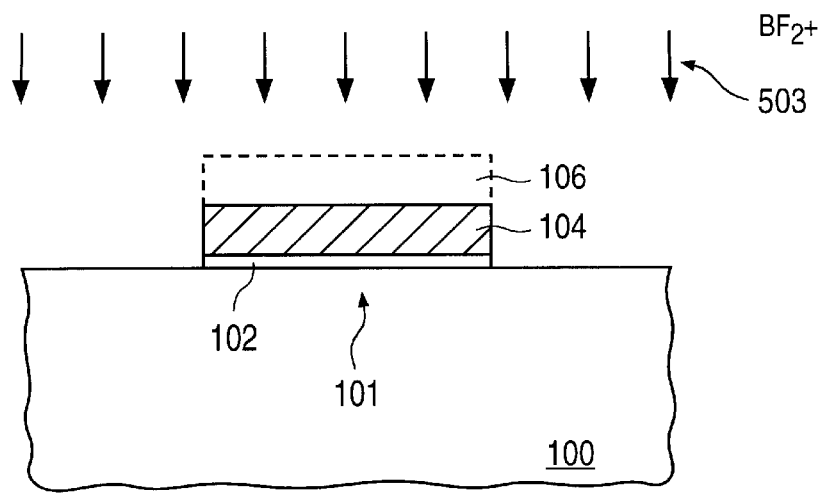
FIGS. 5A–5E are cross-sectional views of a semiconductor process flow in accordance with yet another embodiment of the current invention.

An additional embodiment of the present invention is illustrated in FIGS 5A–5E in which an implanted nitrogen-rich region is formed beneath only the LDD regions on the drain side of a P-channel IGFET. Referring to FIG. 5A, a semiconductor body 100 is shown upon which a P-channel IGFET is to be formed. A gate dielectric 102 is shown formed upon the semiconductor body 100, as before. A polysilicon gate 104 is shown formed atop the gate dielectric 102 having a thickness, for example, in the range of 500–3000 Å. The polysilicon gate 104 is defined by a patterned photoresist layer 106 disposed above the polysilicon gate 104 and used as an etch mask. Such a patterned photoresist layer 106 is preferably removed before further processing. However, the photoresist layer 106 may also optionally remain.

Figure 5B:
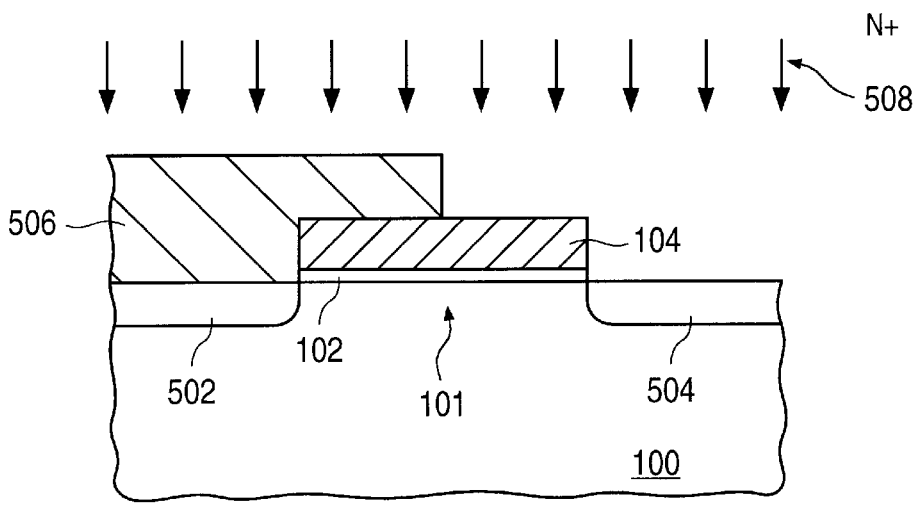

Continuing with the process sequence, a boron implant 503 is next performed as shown in FIG. 5A to form LDD regions in both source and drain sides of the IGFET, using the patterned polysilicon gate 104 as a mask to protect the channel region 101 beneath the gate dielectric 102. The boron implant 503 may be, for example, a $BF_2$ implant. The resulting structure is shown in FIG. 5B, and includes LDD regions 502, 504 which are self-aligned to the edges of the polysilicon gate 104. The boron implant 503 may be performed at an energy in the range of 28–40 keV at a dose of approximately $1\times10^{13}$ atoms/cm$^2$, to achieve the placement of the LDD regions 502, 504 at a depth in the range of 0.02–0.1 microns. Because of the masking effect of the polysilicon gate 104, no boron reaches (for this embodiment) the channel region 101.

Figure 5C:
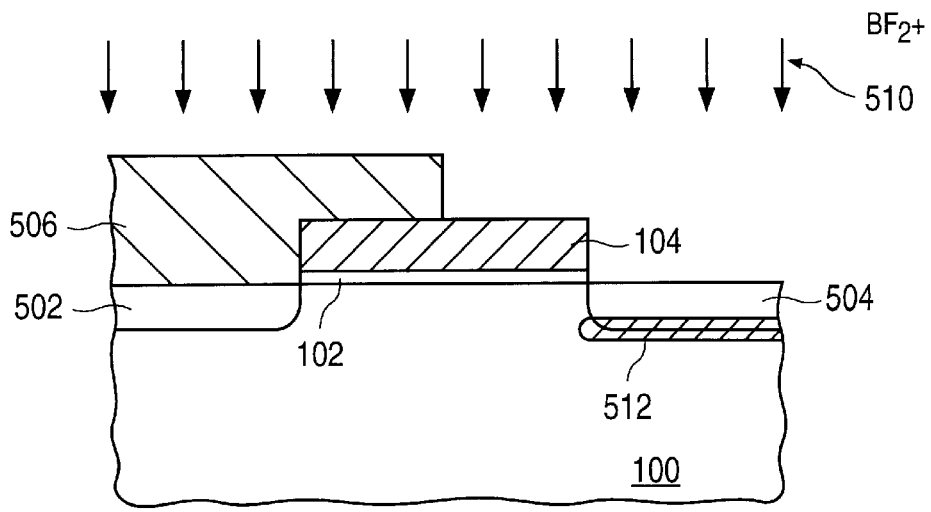

Continuing with the process sequence, a source mask is used to define a patterned photoresist 506 which covers the source side of the IGFET (and optionally the entire N-channel IGFETS) and exposes the drain side. A nitrogen implant 508 is next performed normal to the semiconductor body 100 surface as shown in FIG. 5B using the patterned photoresist 506 and the polysilicon gate 104 to mask the gate dielectric 102, the channel region 101, and the source side of the substrate 100 from the nitrogen implant 508. The nitrogen implant 508 may be performed using any suitable nitrogen-containing material, including molecular nitrogen and atomic nitrogen. Moreover, both the boron implant 503 and the nitrogen implant 508 may be performed using a thin implant oxide covering the surface of the semiconductor body over the source/drain regions (not shown). The resulting structure is shown in FIG. 5C, and includes nitrogen-rich region 512 which is self-aligned to the drain-side edge of the polysilicon gate 104. The nitrogen implant 508 may be performed at an energy in the range of 5–50 keV at a dose in the range of $1.0\times10^{14}$–$5.0\times10^{16}$ atoms/cm$^2$, to achieve the placement of the nitrogen-rich region 512 at a depth in the range of 0.01–0.5 microns. The nitrogen implant 508 also reaches the polysilicon gate 104 on its drain side as well.

Figure 5D:
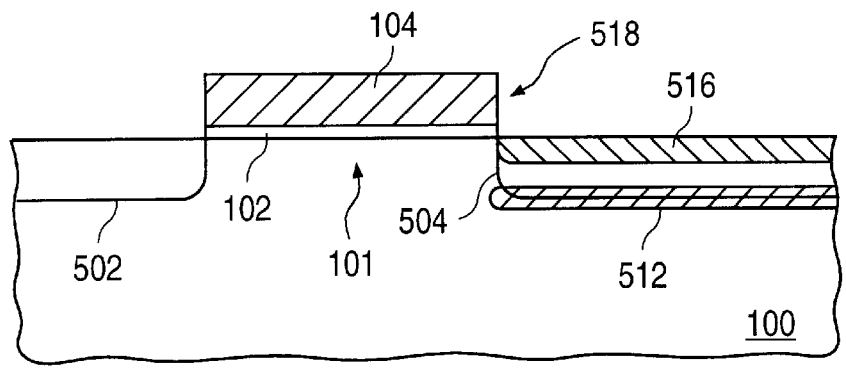

Continuing with the process sequence, a boron implant 510 is next performed as shown in FIG. 5C to form a second, shallower LDD region in the drain side of the IGFET. The boron implant 503 may be, for example, a $BF_2$ implant. The patterned photoresist 506 is then removed. The resulting structure is shown in FIG. 5D, and includes shallow LDD region 516 which is self-aligned to the drain-side edge 518 of the polysilicon gate 104, and is largely disposed at a depth which is shallower than the LDD region 504 and the nitrogen-rich region 512. The boron implant 510 may be performed at an energy in the range of 5–20 keV at a dose of approximately $1\times10^{15}$ atoms/cm$^2$, to achieve the placement of the shallow LDD region 516 at a depth in the range of 0.02–0.10 microns.

Figure 5E:
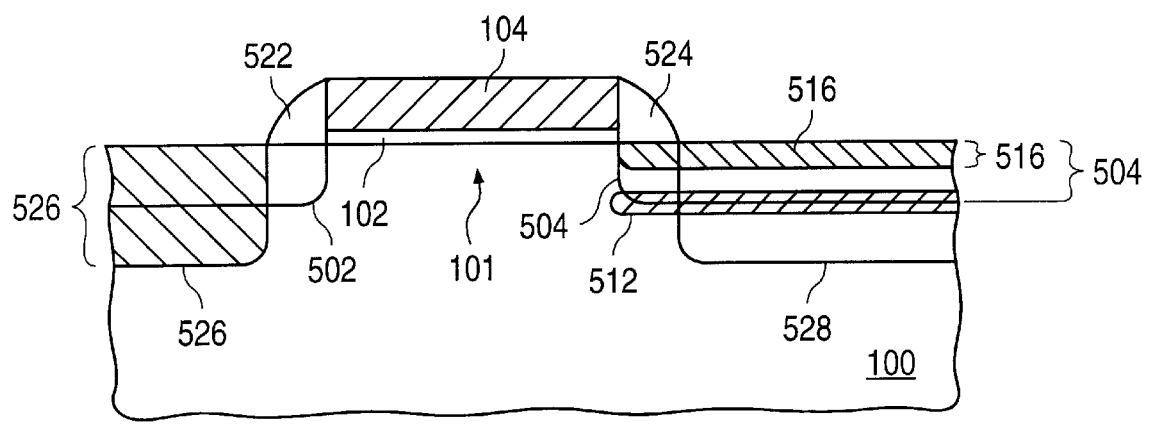

Continuing with the process sequence, spacers are formed on the polysilicon gate 104 and a P+ implant (not shown) performed into the substrate 100 and annealed to form the source/drain regions of the IGFET. Such techniques are well known and need not be discussed in great detail. The resulting structure is shown in FIG. 5E, and includes source region 526 and drain region 528 which are self-aligned to the edges of the spacers 522, 524. The P+ implant may be performed at an energy in the range of 10–50 keV at a dose in the range of $1.0\times10^{15}$–$5.0\times10^{15}$ atoms/cm$^2$, to achieve the placement of the source region 526 and drain region 528 at a greater depth than the LDD regions 502, 504 and the nitrogen-rich region 512, to a depth in the range of 0.01–0.5 microns. The P+ implant is preferably implanted into the polysilicon gate 104 at the same time as when forming the source/drain regions 526, 530.

The presence of the nitrogen-rich region 512 retards the downward diffusion of the implanted boron dopant atoms within the shallow LDD region 516, and allows a greater doping concentration near the surface than otherwise achievable. Consequently, the formation of a shallow LDD region on the drain side of the IGFET is enhanced. Other variations are also possible. For example, a nitrogen liner (e.g., nitrogen-rich region 512) may be fabricated under the LDD regions on both drain and source sides of an IGFET rather than just under the drain side. In such a case, the patterned photoresist 506 is not required, and a nitrogen liner (e.g., analogous to nitrogen-rich region 512) and a shallower LDD region (e.g., analogous to shallow LDD region 516) is created on the source side as well, to result in a symmetrical transistor. As an other example, nitrogen liners may be used to tailor the LDD region doping profile independently for the source and for the drain. As in the above example shown in FIGS. 5A–5E, the drain-side LDD region may received two different implants, while the source-side LDD region receives only one. Alternatively, the drain side may receive one or more LDD implants (e.g., a single shallow implant) to form the drain-side LDD regions while the source side of the IGFET is protected by a masking layer, and the source side of the IGFET may receive one or more (but different) implants (e.g., a single deeper implant) to form the source-side LDD regions while the drain side of the IGFET is protected by a masking layer.

In a typical embodiment for a CMOS process the N-channel transistors are processed in like manner as the P-channel transistor discussed above, except that an n-type dopant atom (e.g., arsenic) is implanted to form the N-channel source/drain regions. As is well known in the art, the P-channel transistors may be masked with photoresist during the n-type source/drain implant step, which photoresist serves to prevent the n-type dopant from reaching the P-channel gate, channel, and source/drain regions. Likewise, the p-type implanting step for the P-channel source/drain regions is performed while the N-channel IGFETs are protected. LDD region diffusion-retarding liners may also be implemented for N-channel IGFETs. Amorphizing implantation operations (e.g., SiC or Ge) may also be used in place of nitrogen implants to form liners for retarding the dopant diffusion during subsequent heat treatment operations. Such alternate implant techniques are more advantageous for N-channel IGFETs than for P-channel IGFETs.

Figure 6A:
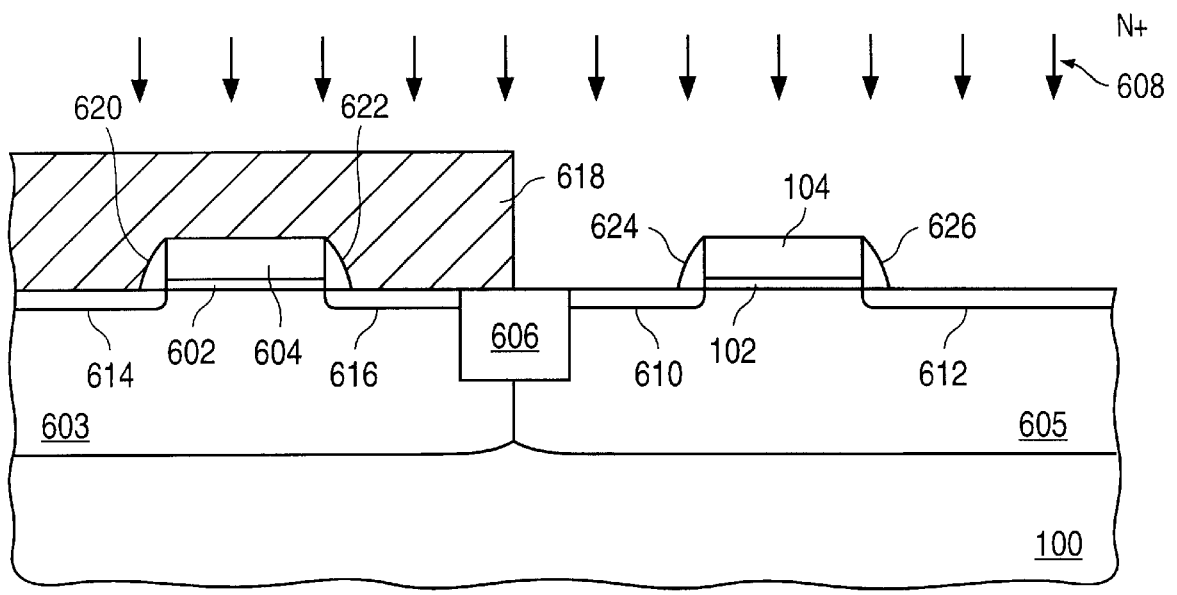
FIGS. 6A–6B re cross-sectional views of a semiconductor process flow in accordance with still yet another embodiment of the current invention.
Figure 6B:
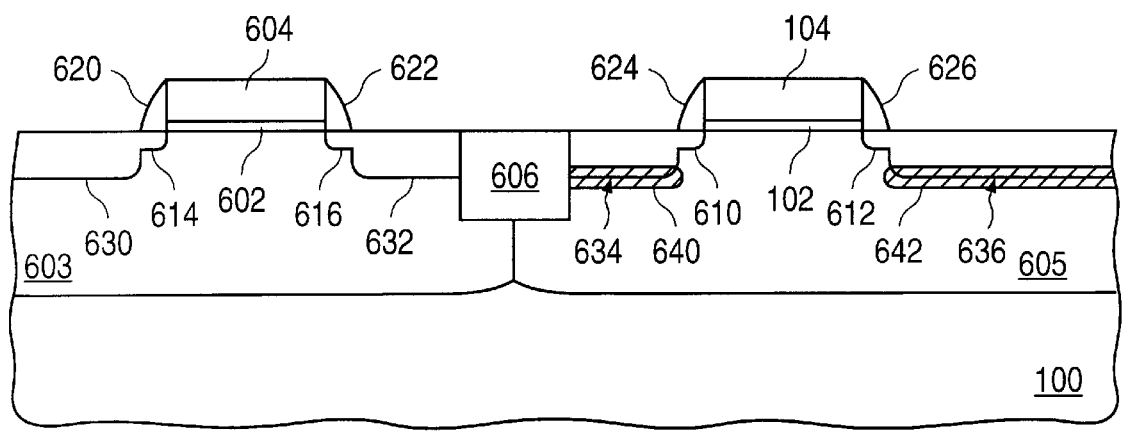

Nitrogen liners may also be advantageously formed, if desired, only within P-channel IGFETs, which have greater dopant diffusion than N-channel IGFETs. Such an embodiment of the current invention is described in relation to FIGS. 6A–6B. A substrate 100 includes a P-well 603 for forming N-channel IGFETs and an N-well 605 for forming P-channel IGFETs, separated at the surface by an oxide isolation 606. Gate oxide 102, 602 and polysilicon gate 104, 604 are formed using convention techniques. A boron implant (not shown) is performed into the N-well 605 to form LDD regions 610, 612 self-aligned to the edges of P-channel IGFETs therewithin. Similarly, an N-channel implant (not shown) is performed into the P-well 603 to form LDD regions 614, 616 self-aligned to the edges of N-channel IGFETs therewithin. Spacers are then formed on the sidewalls of N-channel IGFETs (e.g., spacers 620, 622) and P-channel IGFETs (e.g., spacers 624, 626). A N-well mask is then used to pattern photoresist 618 to expose the N-well regions (e.g., N-well region 605) of substrate 100, which is then followed by a nitrogen implant 608 to form "liners" under the source/drain regions of the P-channel IGFETs. Using similar masking layers, an N+ implant (not shown) is performed into P-well 603 and a P+ implant (not shown) is performed into the N-well 605 to create source and drain regions, which are also then annealed. The resulting structure is shown in FIG. 6B, which shows N-channel source/drain regions 630, 632 aligned substantially with the edges of sidewall spacers 620, 622, and which figure also shows P-channel source/drain regions 634, 636 aligned substantially with the edges of sidewall spacers 624, 626. Also shown are nitrogen liners 640, 642 formed at a depth near the bottom of source/drain regions 634, 636, and which retard the downward diffusion of boron dopants forming these source/drain regions.

In an integrated process (incorporating both N-channel and P-channel IGFETS) which includes such a liner formed below the P-channel IGFETs, the perturbation of the P-channel IGFETs caused by boron dopant diffusion is much less dissimilar than that for the N-channel IGFETs (due to the much lower diffusion coefficient of arsenic over boron). In other words, the P-channel IGFET is less affected by heat treatment operations (compared to the N-channel IGFETs) than would be a comparable process but without the selective nitrogen liners under the P-channel IGFETs. For example, the channel length of the P-channel IGFET is affected less, and remains more alike the N-channel length, especially when techniques such as those depicted in either FIGS. 2A–2C, FIGS. 3A–3D, or FIGS. 4A–4B are also employed.

Limiting the nitrogen implant to the N-well 605 has other advantages. For example, the drive current of N-channel IGFETs may be negatively affected by significant concentration of nitrogen in and near the channel. For circuits that are speed dominated by the drive current of N-channels transistors, circuit performance may be positively enhanced.

Although IGFET transistors are frequently discussed as having a drain, a gate, and a source, in most such devices the drain is interchangeable with the source. This is because the layout and semiconductor processing of the transistor is frequently symmetrical. To reflect this symmetry of most IGFET transistors, the "drain" may be termed the "first source/drain" and the "source" may be termed the "second source/drain". Such terminology is nonetheless equally useful to describe a nonsymmetrical IGFET.

It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOSFET should not be interpreted to literally specify a metal gate FET having an oxide dielectric.

In an LDD technology the source and drain typically include a lightly-doped region which is self-aligned to the gate electrode and typically fairly shallow, and further typically include a heavily-doped region self-aligned to a sidewall spacer (which is formed on the gate electrode) and is usually somewhat deeper than the lightly-doped region. As used herein, a source/drain region may refer to either region (or any other region of a source/drain).

While the invention has been largely described with respect to the embodiments set forth above, the invention is not necessarily limited to these embodiments. For example, such an implanted liner may equally well control the diffusion of dopant atoms in a capacitor structure having an implanted n-type layer or p-type layer, but which does not form a complete IGFET. As an additional example, while gate dielectrics are commonly formed of silicon dioxide, such a gate dielectric 102 in the above embodiments may be formed of a silicon oxynitride, a silicon nitride, or any other suitable insulating material which may be formed in an appropriate thickness. Moreover, while the embodiments have been described in the context of a P-channel IGFET formed within an N-well disposed within a P− epitaxial layer atop a P+ substrate, it should be appreciated that such detailed process descriptions are equally applicable for N-channel IGFET fabrication, and for various other types of semiconductor substrates including a P− substrate with an N-well, an N− substrate with a P-well, and an N− epitaxial layer on an N+ substrate.

The boron implant steps described may utilize B, BF, BF$_2$, or any other source containing boron atoms, and the nitrogen implant step described may utilize atomic nitrogen (N), molecular nitrogen (N$_2$), or any other source containing nitrogen atoms. A given implant may be restricted to forming a corresponding layer within a certain well region (for example, such as a P-well) and excluding other well regions (for example, such as an N-well). A given nitrogen implant step described above may be performed using two different nitrogen implant operations, each at a different energy, to achieve a wider nitrogen liner than achievable using a single implant. Alternatively, two nitrogen implants using the same energy (or a similar energy) but using atomic nitrogen in the first implant and molecular nitrogen in the second implant may be used to achieve a wider nitrogen liner. Accordingly, other embodiments, variations, and improvements not described herein are not necessarily excluded from the scope of the invention, which is defined by the following appended claims.

What is claimed is:

1. In a semiconductor process, a method of forming an insulated-gate field effect transistor (IGFET), the method comprising the steps of:

providing a semiconductor body having a top surface;

forming a gate structure on the top surface;

introducing a first dopant implant into the semiconductor body to form a first and a second source/drain region aligned with the gate structure for the IGFET;

forming a liner substantially beneath the first source/drain region, the liner providing a thermal diffusion barrier for the dopant of the first source/drain region forming spacers beside the gate structure, and introducing a second dopant implant dopant into the first and the second source/drain regions aligned with the spacers and the gate structure, the second dopant extending the first and the second source/drain region beneath the liner.

2. The method as in claim 1 wherein the first dopant implant provides lightly-doped first and second source/drain regions.

3. The method as in claim 1 wherein the second dopant implant provides first and second heavily-doped source/drain regions.

4. The method as in claim 1 wherein the liner comprises a nitrogen liner formed by implantation of a nitrogen-containing material.

5. The method as in claim 1 wherein the liner forming step comprises an implantation of a carbon-containing material.

6. The method as in claim 1 further comprising the steps:

introducing a third dopant implant into the semiconductor body prior to forming the spacers to form a shallow doped region in the first source/drain region; and forming a liner substantially beneath the first region of the second source/drain, to retard subsequent diffusion of dopant comprising the first source/drain region of the second source/drain aligned with the gate structure.

7. The method as in claim 1 comprising the step of:

forming a second IGFET of opposite conductivity type as the particular conductivity type, said second IGFET formed without any liner.

8. The method as in claim 1 further comprising the step of:

forming a second IGFET of opposite conductivity type as the particular conductivity type, said second IGFET including a liner formed substantially beneath a first region of a first source/drain, to retard subsequent diffusion of dopants comprising the first region of the first source/drain.

9. In a semiconductor process, a method of forming an insulated-gate field effect transistor (IGFET) the method comprising the steps of:

providing a semiconductor body having a top surface;

forming at least a portion of a gate structure on the top surface:

introducing a first dopant implant into the semiconductor body to form lightly doped source/drain regions aligned with the gate structure for the IGFET;

forming spacers on walls of the gate structure;

introducing a second dopant implant to form source/drain regions extending beneath the lightly doped source drain regions and aligned with the gate structure and with the spacers; and forming a nitrogen liner substantially beneath the source/drain regions and generally aligned with the gate structure and the spacers, the nitrogen liner providing a thermal diffusion barrier for the dopant.

10. The method as in claim 9 wherein the source/drain region of the second dopant implant comprises a heavily-doped region.

11. The method as in claim 9 wherein the nitrogen liner is formed substantially adjacent to the source/drain region of the second dopant implant in a vertical direction.

12. The method as in claim 9 wherein the nitrogen liner is formed substantially spaced from the source/drain region of the second dopant implant in a vertical direction.

13. The method as in claim 9 wherein the nitrogen liner retards vertical diffusion of a dopant from the first and second dopant implants in a direction away from the top surface.

14. The method as in claim 9 wherein the nitrogen liner is formed by implanting nitrogen at an angle substantially perpendicular to the top surface.

15. In a semiconductor process, a method of forming an insulated-gate field effect transistor (IGFET), the method comprising the steps of:

providing a semiconductor body having a top surface;

introducing a dopant into the semiconductor body to form a source/drain region for the IGFET; and forming a nitrogen liner substantially beneath the source/drain region, the nitrogen liner providing a thermal diffusion barrier for the dopant wherein the nitrogen liner includes a portion which extends laterally beneath a gate electrode of the IGFET.

16. The method as in claim 15 wherein the nitrogen liner retards vertical diffusion of the dopant in a direction away from the top surface of the semiconductor body, and further retards lateral diffusion of the dopant in a direction parallel to the top surface.

17. The method as in claim 15 wherein the portion of the nitrogen liner extending laterally beneath the gate electrode is formed by implanting nitrogen at an angle relative to the top surface.

18. The method as in claim 15 wherein the portion of the nitrogen liner extending laterally beneath the gate electrode extends up to the top surface.

19. The method as in claim 15 wherein the portion of the nitrogen liner extending laterally beneath the gate electrode is formed by a plurality of angled nitrogen implantation steps relative to the top surface, each performed in a different direction into the semiconductor body.

20. The method as in claim 19 wherein a portion of the nitrogen liner disposed beneath the source/drain region is formed by implanting nitrogen at an angle substantially perpendicular to the top surface.

21. The method as in claim 15 further comprising the step of forming a gate electrode disposed upon the semiconductor body.

22. The method as in claim 21 wherein the nitrogen liner is formed before the gate electrode is formed.

23. The method as in claim 21 wherein the nitrogen liner is formed after the gate electrode is formed.

24. In a semiconductor process, a method of forming a nitrogen liner for an insulated-gate field effect transistor (IGFET) comprising the steps of:

providing a semiconductor body having a top surface;

implanting nitrogen into the semiconductor body beneath a source region and a drain region of the IGFET, said nitrogen implanted to a first death below the top surface of the semiconductor body; and introducing a dopant within said source and drain regions of the IGFET, said having a depth less than the first depth; and introducing nitrogen into the semiconductor body within a portion of a channel region of the IGFET beneath a gate electrode of the IGFET.

25. The method as in claim 24 wherein the nitrogen introducing step includes:

implanting nitrogen at an angle relative to the top surface of the semiconductor body.

26. The method as in claim 24 wherein the nitrogen introducing step includes the step of:

annealing the nitrogen previously implanted into the semiconductor body beneath the source and drain regions, said annealing causing diffusion of the nitrogen, thereby extending a region containing the nitrogen to extend beneath the gate electrode.

27. The method as in claim 24 wherein the nitrogen introducing step includes the step of:

implanting nitrogen through the gate electrode and into the channel region of the IGFET.

28. The method as in claim 24 further comprising the step of:

introducing nitrogen into the semiconductor body with portions of a channel region of the IGFET beneath a gate electrode of the IGFET, said portions being adjacent to said source and drain regions.

29. The method as in claim 28 wherein the nitrogen introducing step includes the step of:

implanting nitrogen using a plurality of angled implants relative to the top surface of the semiconductor body.

30. The method as in claim 29 wherein the plurality of angled implants comprises four separate angled implants, each performed in a different direction into the semiconductor body.

31. The method as in claim 28 wherein the nitrogen introducing step includes the step of:

annealing the nitrogen previously implanted into the semiconductor body beneath the source and drain regions, said annealing causing diffusion of the nitrogen, thereby extending regions containing the nitrogen to extend beneath the gate electrode.

32. The method as in claim 28 wherein the nitrogen introducing step includes the step of:

implanting nitrogen through the gate electrode and into the channel region of the IGFET.

33. The method as in claim 28 wherein the nitrogen introducing step includes the step of:

implanting nitrogen into the channel region of the IGFET before formation of a gate electrode of the IGFET.

34. The method as in claim 32 wherein the step of implanting nitrogen into the semiconductor body beneath the source and drain regions of the IGFET, and the step of implanting nitrogen through the gate electrode and into the channel region of the IGFET, are performed in a single implantation step.

35. The method as in claim 32 wherein the step of implanting nitrogen into the semiconductor body beneath the source and drain regions of the IGFET, and the step of implanting nitrogen through the gate electrode and into the channel region of the IGFET, are performed using two different nitrogen implants each having a different implant energy.

36. The method as in claim 32 wherein the step of implanting nitrogen into the semiconductor body beneath the source and drain regions of the IGFET, and the step of implanting nitrogen through the gate electrode and into the channel region of the IGFET, are each performed using an atomic nitrogen implant or a molecular nitrogen implant.

37. The method as in claim 24 wherein the implanted nitrogen is chosen from the group consisting of molecular nitrogen ($N_2$) and atomic nitrogen (N).

* * * * *